United States Patent
Nakazawa et al.

(10) Patent No.: US 9,431,270 B2
(45) Date of Patent: Aug. 30, 2016

(54) METHOD FOR PRODUCING SEMICONDUCTOR DEVICE

(71) Applicant: FUJI ELECTRIC CO., LTD., Kawasaki-shi (JP)

(72) Inventors: Haruo Nakazawa, Matsumoto (JP); Masaaki Ogino, Matsumoto (JP); Hidenao Kuribayashi, Matsumoto (JP); Hideaki Teranishi, Hachioji (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/478,343

(22) Filed: Sep. 5, 2014

(65) Prior Publication Data

US 2014/0377938 A1 Dec. 25, 2014

Related U.S. Application Data

(63) Continuation of application No. PCT/JP2013/063721, filed on May 16, 2013.

(30) Foreign Application Priority Data

May 22, 2012 (JP) ................................. 2012-116623

(51) Int. Cl.

| | |
|---|---|
| *H01L 21/32* | (2006.01) |
| *H01L 21/322* | (2006.01) |
| *C30B 31/22* | (2006.01) |
| *H01L 29/66* | (2006.01) |
| *C30B 29/06* | (2006.01) |
| *H01L 21/265* | (2006.01) |
| *H01L 21/00* | (2006.01) |

(52) U.S. Cl.
CPC ............ *H01L 21/3221* (2013.01); *C30B 29/06* (2013.01); *C30B 31/22* (2013.01); *H01L 21/26513* (2013.01); *H01L 21/3225* (2013.01);

(Continued)

(58) Field of Classification Search
None
See application file for complete search history.

(56) References Cited

U.S. PATENT DOCUMENTS

| 5,902,135 A | 5/1999 | Schulze |
| 7,741,192 B2 | 6/2010 | Shimoyama et al. |

(Continued)

FOREIGN PATENT DOCUMENTS

| JP | 09227300 A | 9/1997 |
| JP | 2006-080269 | * 3/2006 |

(Continued)

OTHER PUBLICATIONS

International Search Report issued in PCT/JP2013/063721 dated Aug. 6, 2013.

*Primary Examiner* — Evren Seven
(74) *Attorney, Agent, or Firm* — Rossi, Kimms & McDowell LLP

(57) ABSTRACT

A method for producing a semiconductor device is disclosed which includes a diffusion step of forming, on a CZ-FZ silicon semiconductor substrate, a deep diffusion layer involving a high-temperature and long-term thermal diffusion process which is performed at a thermal diffusion temperature of 1290° C. to a melting temperature of a silicon crystal for 100 hours or more; and a giving step of giving a diffusion source for an interstitial silicon atom to surface layers of two main surfaces of the silicon semiconductor substrate before the high-temperature, long-term thermal diffusion process. The step of giving the diffusion source for the interstitial silicon atom to the surface layers of the two main surfaces of the silicon semiconductor substrate is performed by forming thermally-oxidized films on two main surfaces of the silicon semiconductor substrate or by implanting silicon ions into surface layers of the two main surfaces of the silicon semiconductor substrate.

6 Claims, 10 Drawing Sheets

(52) U.S. Cl.
CPC ... *H01L 29/66325* (2013.01); *H01L 29/66333* (2013.01)

(56) References Cited

U.S. PATENT DOCUMENTS

2006/0038206 A1    2/2006   Shimoyama et al.
2011/0215435 A1    9/2011   Wakimoto et al.

FOREIGN PATENT DOCUMENTS

| JP | 2006080269 A |   | 3/2006  |
| JP | 2007-314374  | * | 5/2006  |
| JP | 2006303410 A |   | 11/2006 |
| JP | 2008-171952  | * | 1/2007  |
| JP | 2007314374 A |   | 12/2007 |
| JP | 2008171952 A |   | 7/2008  |
| JP | 2011181770 A |   | 9/2011  |

\* cited by examiner

METHOD FOR PRODUCING SEMICONDUCTOR DEVICE

BACKGROUND OF THE INVENTION

A. Field of the Invention

The present invention relates to a method for producing a semiconductor device.

B. Description of the Related Art

In recent years, a matrix converter has been known as a direct-link-type conversion circuit which does not require a direct current (DC) smoothing circuit including, for example, an electrolytic capacitor or a DC reactor, in a power conversion circuit that performs alternating current (AC)/AC conversion, AC/DC conversion, and DC/AC conversion using a semiconductor element. Since the matrix converter is used at an AC voltage, a plurality of switching devices forming the matrix converter require a bidirectional switching device which can control a current in the forward direction and the reverse direction.

In recent years, a bidirectional switching device has been proposed in terms of reducing the size and weight of a circuit, improving efficiency and response, and reducing costs. In this device, two reverse blocking insulated gate bipolar transistors (IGBTs) are connected in inverse parallel to each other, as illustrated in the equivalent circuit diagram of FIG. 10. FIG. 10 is a circuit diagram illustrating the equivalent circuit of the bidirectional switching device using the reverse blocking IGBT. The inverse parallel connection structure of the reverse blocking IGBTs has an advantage that a diode for blocking a reverse voltage is not required. That is, the reverse blocking IGBT means a device which equalizes the reverse breakdown voltage to the forward breakdown voltage and has high reliability of breakdown voltage. In the general IGBT which is used in the power conversion circuit according to the related art, an effective reverse breakdown voltage is not required, similarly to the general transistor or insulated gate field effect transistor (MOSFET) without a reverse breakdown voltage. Therefore, an IGBT which has a reverse breakdown voltage lower than the forward breakdown voltage and has a low reliability of breakdown voltage is sufficient for the bidirectional switching device.

Next, the structure of the reverse blocking IGBT according to the related art will be described. FIG. 9 is a cross-sectional view schematically illustrating the cross-sectional structure of the reverse blocking IGBT according to the related art. FIG. 9 is described in the following JP 2006-80269 A. The reverse blocking IGBT according to the related art has a structure in which an active region 110 is provided at the center, a breakdown voltage structure region 120 is provided in an outer circumferential portion surrounding the active region 110, and a p-type separation layer 31 is provided so as to surround the outer circumference of the breakdown voltage structure region 120. Therefore, the depth of the p-type separation layer 31 needs to be very large in order to form the p-type separation layer 31 using only thermal diffusion from one main surface of a semiconductor substrate, and a high-temperature and long-term thermal diffusion (drive-in) process is involved.

The active region 110 illustrated in FIG. 9 is a main current path of a vertical IGBT including, for example, an n⁻ drift region 1, a p-type base region 2, an n⁺ emitter region 3, a gate insulating film 4, a gate electrode 5, an interlayer insulating film 6, an emitter electrode 9, a p-type collector region 10, and a collector electrode 11. The p-type separation layer 31 is a p-type region which is formed by the thermal diffusion of boron (B) at a depth that extends from the front surface of the semiconductor substrate to the p-type collector region 10 provided on the rear surface side. A termination portion of a pn junction surface between the p-type collector region 10 and the n⁻ drift region 1, which is a reverse breakdown voltage junction, is not exposed from a side end surface 12 of a chip, which is a cutting surface during chipping, by the p-type separation layer 31, but it is exposed from a surface 13 of the breakdown voltage structure region 120 that is protected by an insulating film. Therefore, the reverse blocking IGBT including the p-type separation layer 31 can improve the reliability of the reverse breakdown voltage.

FIG. 6A to 6D and FIG. 7A to 7D are cross-sectional views sequentially illustrating the producing steps of an impurity diffusion process for forming a p-type separation layer 104 of the reverse blocking IGBT using coating diffusion and ion implantation, respectively. FIG. 6 is a cross-sectional view illustrating the state of the separation layer which is being formed by coating diffusion according to the related art. FIG. 7 is a cross-sectional view illustrating the state of the separation layer which is being formed by ion implantation according to the related art. FIG. 8 is a cross-sectional view illustrating the end structure of a reverse blocking IGBT according to the related art. FIG. 8(a) illustrates the reverse blocking IGBT in which a separation layer is formed by the diffusion layer that is formed by the producing steps illustrated in FIGS. 6 and 7 so as to pass through a semiconductor substrate. First, a thermally-oxidized film 101 with a thickness of about 1.5 μm to 2.5 μm is formed as a dopant mask on the front surface of a semiconductor substrate 100 with a large thickness of 600 μm or more which is made of silicon (Si) as a semiconductor material (FIG. 6A and FIG. 7A).

The thermally-oxidized film 101 is patterned to form an opening portion 102 which introduces impurities for forming the separation layer (FIG. 6B and FIG. 7B). A boron source 103, which is impurities, is coated on the opening portion 102 to form a shallow boron deposit layer (or boron ion implantation 105 is performed for a portion of the semiconductor substrate 100 which is exposed through the opening portion 102 of the thermally-oxidized film 101) (FIG. 6C and FIG. 7C). The thermally-oxidized film 101 which is used as a dopant mask for the selective diffusion of boron (diffusion for the p-type separation layer) is removed. A heat treatment is performed at a high temperature (1300° C.) for a long time (100 hours to 200 hours) to form the p-type diffusion layer 104 with a depth of about 100 μm to 200 μm (FIG. 6D and FIG. 7D). The p-type diffusion layer 104 is used as the separation layer.

Then, a process (not illustrated) of forming an oxide film on the front surface of the semiconductor substrate 100 surrounded by the p-type diffusion layer 104 again to form a MOS gate structure and a necessary front-surface-side functional region is performed. The rear surface of the semiconductor substrate 100 is ground and removed such that the bottom of the p-type diffusion layer 104 is exposed, as represented by a dashed line, thereby reducing the thickness of the semiconductor substrate 100 (FIG. 6D and FIG. 7D). A rear surface structure including a p-type collector region and a collector electrode (which are not illustrated) is formed on the ground rear surface and the semiconductor substrate 100 is cut along a scribe line 108 which is disposed in a central portion of the p-type diffusion layer 104. The reverse blocking IGBT which is divided as a chip is illustrated in the cross-sectional views of FIG. 8A and FIG. 9.

However, as illustrated in FIGS. 6 and 7, in the reverse blocking IGBT in which the p-type separation layer is formed by coating diffusion or ion implantation, a high-temperature and long-term thermal diffusion process is needed in order to form a deep p-type separation layer as described above. As a result, during the high-temperature and long-term thermal diffusion process, an oxygen atom is introduced between the lattices in the semiconductor substrate. As a result, an oxygen precipitate is generated, the phenomenon in which oxygen is changed to a donor occurs, or a crystal defect occurs. When the crystal defect is introduced, there is a concern that the amount of leakage current will increase at the pn junction in the semiconductor substrate or the breakdown voltage and reliability of the insulating film formed on the semiconductor substrate will be significantly reduced.

In order to solve the problems caused by the high-temperature and long-term thermal diffusion process, a plurality of methods have been developed which reduce the diffusion depth of the p-type separation layer to shorten the time required for the high-temperature thermal diffusion process. For example, there is a method which forms a V-groove in the rear surface of a semiconductor substrate to reduce the depth of the separation layer, thereby shortening the time required for a high-temperature thermal diffusion process for forming a separation layer (for example, see U.S. Pat. No. 7,741,192 JP 2006-303410 A, and JP 2011-181770 A). FIG. 8B illustrates an example of the end structure of a reverse blocking IGBT produced by U.S. Pat. No. 7,741,192 JP 2006-303410 A, and JP 2011-181770 A. In addition, a method has been known which forms a trench 109 having a vertical side wall with a depth of 200 μm from the front surface of a semiconductor substrate 100 and forms a separation layer 104b with a small depth on the side wall, thereby reducing the time required for a high-temperature thermal diffusion process, as illustrated in the cross-sectional view of FIG. 11. FIG. 11 is a cross-sectional view illustrating the structure of a reverse blocking IGBT according to the related art including the separation layer which is formed using the trench. In FIG. 11, reference numeral 106 indicates a p-type collector region, reference numeral 108 indicates a scribe line, and reference numeral 110 indicates a MOS gate structure provided on the front surface side of a substrate.

In the related art, the semiconductor substrates which are used to produce high-breakdown-voltage power devices include a silicon semiconductor substrate (hereinafter, referred to as an FZ silicon semiconductor substrate) that is cut from a silicon single crystal (hereinafter, referred to as an FZ silicon single crystal) produced by a floating zone (FZ) method using polycrystalline silicon (hereinafter, referred to as FZ polycrystalline silicon). The FZ silicon semiconductor substrate has advantages that dislocation included in a crystal is small and the content of oxygen is small, as compared to a silicon semiconductor substrate (hereinafter, referred to as a CZ silicon semiconductor substrate) that is cut from a silicon single crystal (hereinafter, referred to as a CZ silicon single crystal) produced by a Czochralski (CZ) method. Therefore, the FZ silicon single crystal is particularly indispensable as a silicon crystal for a power device with a high breakdown voltage and high current capacity. An FZ silicon semiconductor substrate with a large diameter is required in order to reduce the costs of the device. However, it is difficult to increase the diameter of the FZ silicon semiconductor substrate, as compared to the CZ silicon semiconductor substrate.

In general, as described above, FZ polycrystalline silicon is used as a raw material for the FZ silicon single crystal. However, the FZ polycrystalline silicon which is needed as a raw material in the FZ method needs to have high purity, to be less likely to be cracked or broken, to have a uniform grain-boundary structure, to have a diameter suitable for the FZ silicon single crystal to be produced, and to have a cylindrical shape which is flat, has a large crank, and has a good surface state. The production yield and productivity of the FZ polycrystalline silicon are significantly less than those of nugget-shaped polycrystalline silicon (hereinafter, referred to as CZ polycrystalline silicon) used in the CZ method. There is an increasing demand for the CZ polycrystalline silicon with a diameter of 300 mm. A method has been known which produces an FZ silicon single crystal with a large diameter, using, as a raw material, a large-diameter CZ silicon single crystal which is stably obtained from polycrystalline silicon, instead of the FZ polycrystalline silicon according to the related art (for example, see the following JP 2007-314374 A). Hereinafter, a silicon semiconductor substrate which is cut from the FZ silicon single crystal produced by this method is referred to as a CZ-FZ silicon semiconductor substrate.

However, as described above, in the method disclosed in the above-mentioned U.S. Pat. No. 7,741,192 JP 2006-303410 A, and JP 2011-181770 A in which the V-groove is formed in the rear surface of the semiconductor substrate, the depth of the p-type diffusion layer 104a from the front surface of the substrate is reduced to reliably shorten the thermal diffusion time at a high temperature. However, when the depth of the p-type diffusion layer 104a is too small, another problem occurs. Specifically, when the depth of the diffusion layer 104a from the front surface of the substrate is reduced in order to shorten the thermal diffusion time at a high temperature, the depth of the V-groove needs to be increased by a value corresponding to the reduction in the depth. As a result, a new problem that the semiconductor substrate 100 is likely to be broken occurs.

In the method which forms the p-type separation layer 104b using the trench 109 with the side wall vertical to the main surface to reduce the thermal diffusion time at a high temperature as illustrated in FIG. 11, the following problem occurs. For example, when a typical dry etching device is used, the time required to etch each trench 109 with a depth of about 200 μm is about 100 minutes. Therefore, when the p-type separation layer 104b is formed using the trench 109, the lead time increases and the number of maintenances increases.

In the high-temperature and long-term thermal diffusion process described with reference to FIGS. 6 to 8, when the above-mentioned CZ-FZ silicon semiconductor substrate is used, the yield of the semiconductor device is reduced (lowered) by the influence of crystal defects which synergistically occur due to the vacancies that are included in the substrate at the beginning (before a semiconductor device producing process) and crystal defects which newly occur in the semiconductor substrate due to an atmosphere gas species during a thermal diffusion process, as compared to the case in which the FZ silicon semiconductor substrate according to the related art is used.

SUMMARY OF THE INVENTION

In order to solve the above-mentioned problems of the related art, the invention provides a method for producing a semiconductor device which can suppress the occurrence of a crystal defect in the silicon semiconductor substrate due to the high-temperature and long-term thermal diffusion process, even when the method includes a step of forming a deep diffusion layer involving a high-temperature and long-term thermal diffusion process, which is performed at a high temperature of 1290° C. or more for a long time of 100 hours, using a silicon semiconductor substrate that is cut from an FZ silicon crystal produced using a CZ silicon crystal.

In order to solve the above-mentioned problems, a method for producing a semiconductor device according to an aspect of the invention has the following characteristics. A diffusion step of forming a diffusion layer involving a high-temperature and long-term thermal diffusion process, which is performed at a thermal diffusion temperature in a range of 1290° C. to a melting temperature of a silicon crystal for 100 hours or more, on a silicon semiconductor substrate produced by an FZ method is performed. A giving step of giving a diffusion source for a silicon atom, which becomes an interstitial atom in the silicon semiconductor substrate in the diffusion step, to surface layers of two main surfaces of the silicon semiconductor substrate is performed before the diffusion step.

In the method for producing a semiconductor device according to the above-mentioned aspect of the invention, an FZ semiconductor substrate that is cut from an FZ silicon crystal, which is produced by the FZ method using polycrystalline silicon as a raw material, may be used as the silicon semiconductor substrate.

In the method for producing a semiconductor device according to the above-mentioned aspect of the invention, a semiconductor substrate that is cut from a CZ-FZ silicon crystal, which is produced by the FZ method using CZ polycrystalline silicon as a raw material, may be used as the silicon semiconductor substrate.

In the method for producing a semiconductor device according to the above-mentioned aspect of the invention, the giving step may be a step of forming thermally-oxidized films on the two main surfaces of the silicon semiconductor substrate.

In the method for producing a semiconductor device according to the above-mentioned aspect of the invention, the thermally-oxidized film may have a thickness of 1.0 μm to 2.5 μm.

In the method for producing a semiconductor device according to the above-mentioned aspect of the invention, the thermally-oxidized film may have a thickness of 1.5 μm to 2.5 μm.

In the method for producing a semiconductor device according to the above-mentioned aspect of the invention, the giving step may be a step of implanting the silicon atoms into surface layers of the two main surfaces of the silicon semiconductor substrate.

In the method for producing a semiconductor device according to the above-mentioned aspect of the invention, a dose of the silicon atoms implanted in the giving step may be equal to or greater than $1\times10^{14}$ $(cm^{-2})$.

In the method for producing a semiconductor device according to the above-mentioned aspect of the invention, the dose of the silicon atoms implanted in the giving step may be in the range of $1\times10^{15}$ $(cm^{-2})$ to $1\times10^{16}$ $(cm^{-2})$.

In the method for producing a semiconductor device according to the above-mentioned aspect of the invention, the diffusion step may form the diffusion layer which will be a separation layer forming a reverse blocking insulated gate bipolar transistor.

According to the method for producing a semiconductor device of the invention, even when the method includes a step of forming a deep diffusion layer involving a high-temperature and long-term thermal diffusion process, which is performed at a high temperature of 1290° C. or more for a long time of 100 hours, using a silicon semiconductor substrate that is cut from an FZ silicon single crystal produced by an FZ method using a CZ silicon crystal, in order to increase a diameter and to reduce costs, it is possible to suppress the occurrence of a crystal defect in the semiconductor substrate due to the high-temperature and long-term thermal diffusion process.

BRIEF DESCRIPTION OF THE DRAWINGS

The foregoing advantages and features of the invention will become apparent upon reference to the following detailed description and the accompanying drawings, of which:

FIGS. 1A to 1C are diagrams schematically illustrating a mechanism in which a nitrogen precipitate defect does not occur in a first method of a method for producing a semiconductor device according to the invention;

DETAILED DESCRIPTION OF SPECIFIC EMBODIMENTS

Figure 2A:
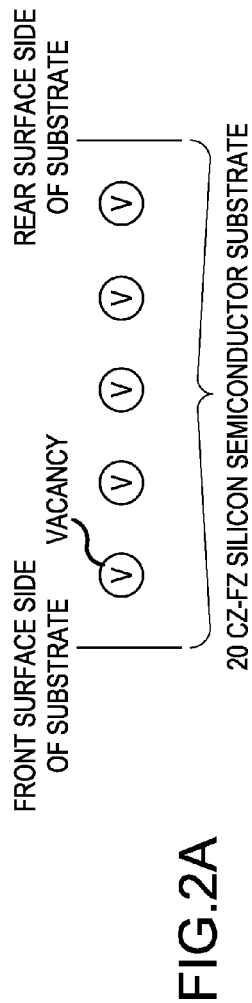
FIGS. 2A to 2C are diagrams schematically illustrating a mechanism in which a nitrogen precipitate defect does not occur in a second method of the method for producing the semiconductor device according to the invention.

Hereinafter, a preferred embodiment of a method for producing a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiment and the accompanying drawings, the same components are denoted by the same reference numerals and the description thereof will not be repeated. In addition, in the accompanying drawings described in the embodiment, for ease of viewing or understanding, a scale and a dimensional ratio are different from the actual scale and dimensional ratio. The invention is not limited to the following embodiment as long as it does not depart from the scope and spirit thereof.

Embodiment

Figure 8A:
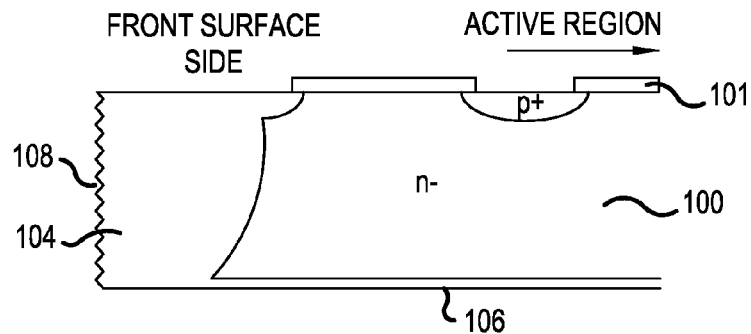
FIGS. 8A and 8B are cross-sectional views illustrating the end structure of the reverse blocking IGBT according to the related art.
Figure 8B:
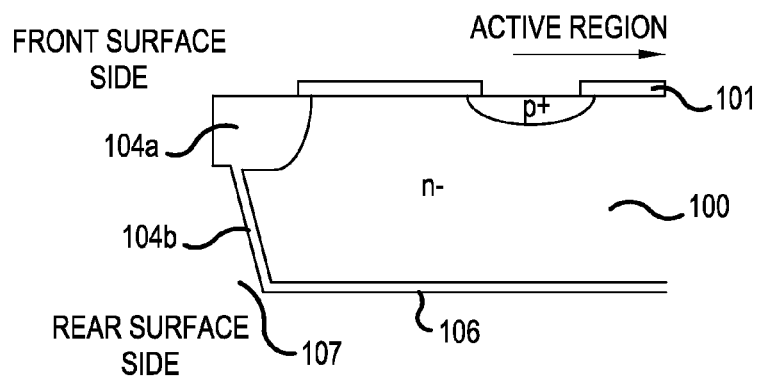
Figure 9:
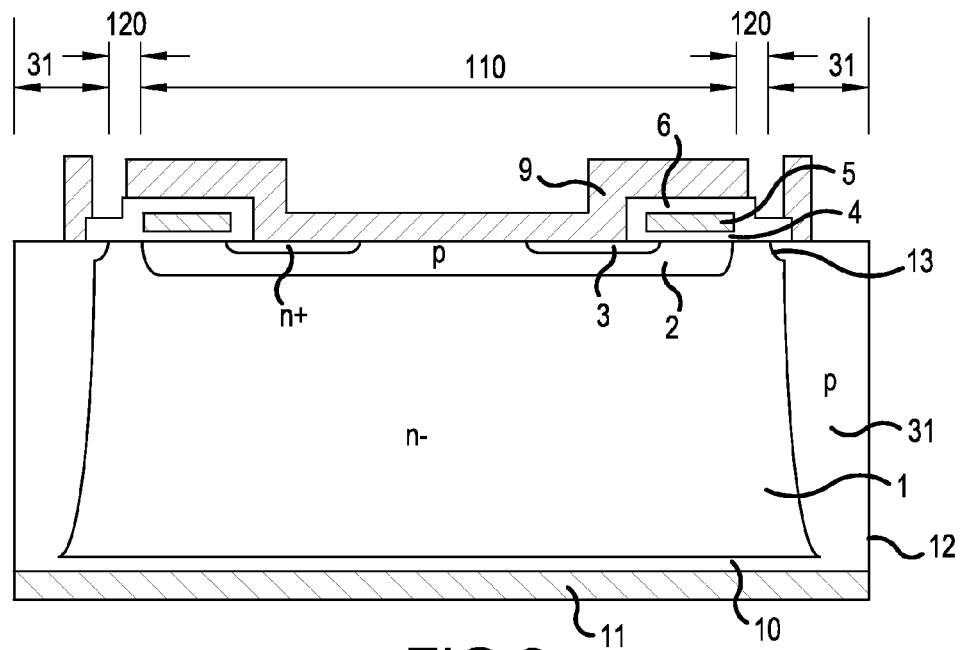
FIG. 9 is a cross-sectional view schematically illustrating the cross-sectional structure of the reverse blocking IGBT according to the related art.
Figure 10:
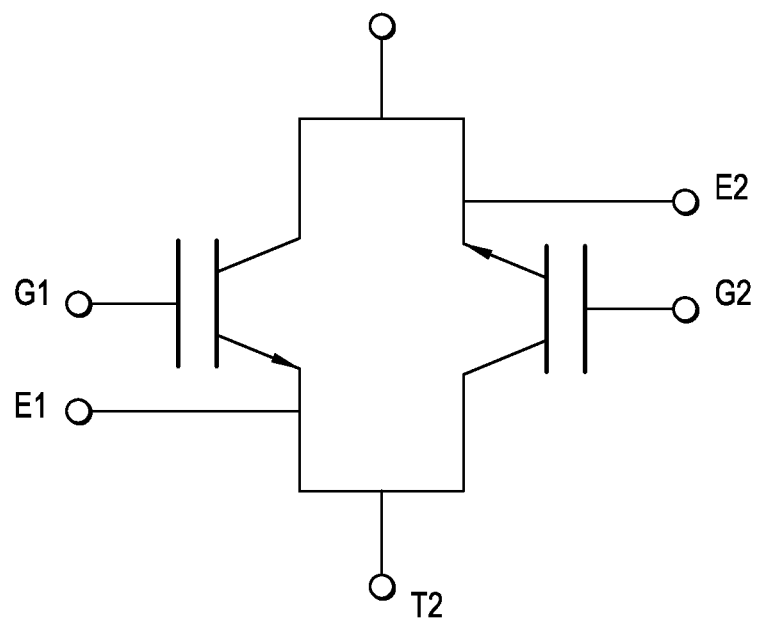
FIG. 10 is a circuit diagram illustrating an equivalent circuit of a bidirectional switching device used in the reverse blocking IGBT.
Figure 11:
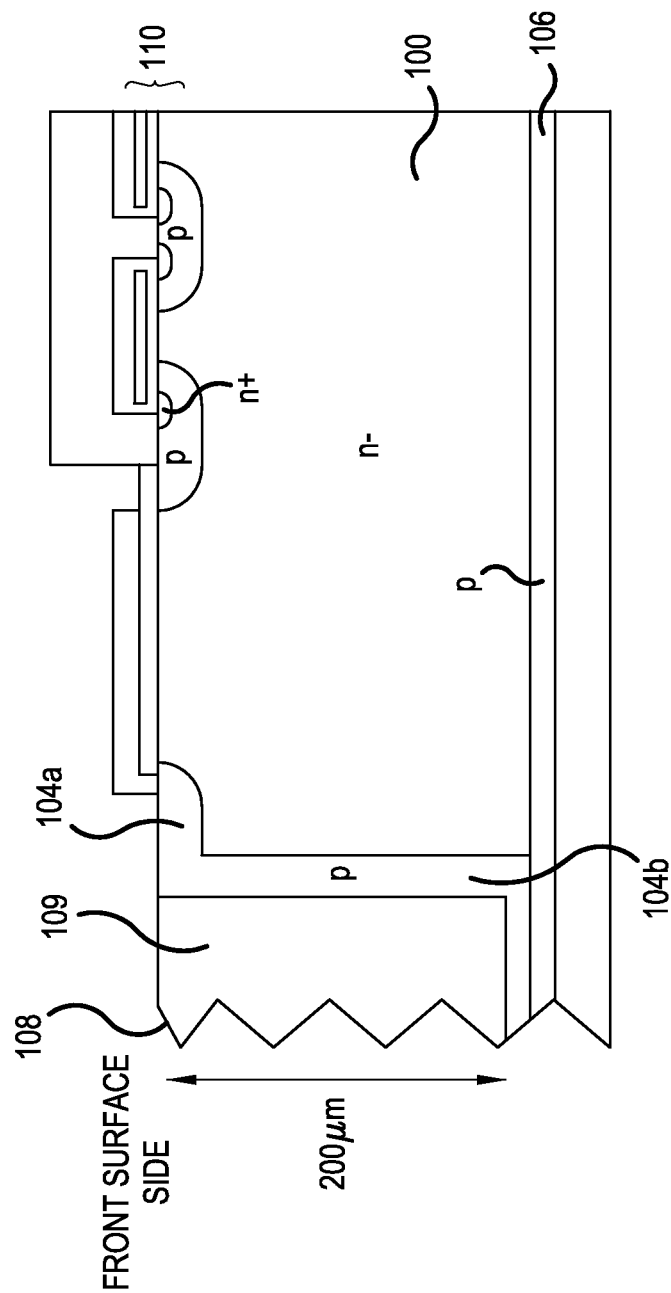
FIG. 11 is a cross-sectional view illustrating the structure of the reverse blocking IGBT according to the related art which includes a separation layer formed using a trench.

Hereinafter, as an example of a method for producing a semiconductor device according to an embodiment of the invention, a method will be described which produces a reverse blocking IGBT with a reverse breakdown voltage of 600 V using a floating zone (FZ) silicon (Si) semiconductor substrate (CZ-FZ silicon semiconductor substrate) that is cut from an FZ silicon single crystal (FZ silicon crystal ingot) produced by an FZ method using a Czochralski (CZ) silicon crystal ingot as a raw material, in order to increase a diameter and to reduce costs. The CZ silicon ingot is a CZ silicon single crystal which is produced by a CZ method using nugget-shaped polycrystalline silicon (CZ polycrystalline silicon) as a raw material. In particular, a diffusion process for forming a deep diffusion layer involving high-temperature and long-term thermal diffusion (drive-in) which is the characteristics of the invention, for example, a separation layer with a depth that extends from the front surface to the rear surface of a semiconductor substrate will be described. Most of the following diffusion process uses the process of producing the reverse blocking IGBT according to the related art which has been described above with reference to FIG. 7 and FIG. 8A.

The method for producing the reverse blocking IGBT according to the embodiment of the invention differs from the method for producing the reverse blocking IGBT according to the related art in that, in the method for producing the reverse blocking IGBT according to the embodiment of the invention, a process for providing a supply source (diffusion source) for an interstitial silicon atom (a silicon (Si) atom which will be an interstitial atom) with a large diffusion coefficient on the front surface or the rear surface of a silicon semiconductor substrate is performed immediately before the thermal diffusion of a separation layer requiring high temperature and a long time. As the process, for example, there are the following processes: a process of newly forming thermally-oxidized films on two main surfaces of the CZ-FZ silicon semiconductor substrate (hereinafter, referred to as a first method); and a process of implanting silicon atoms into surface layers of two main surfaces of the CZ-FZ silicon semiconductor substrate (hereinafter, referred to as a second method).

The process of forming the thermally-oxidized films on two main surfaces of the CZ-FZ silicon semiconductor substrate, which is the first method according to the embodiment of the invention, will be described. First, a thermally-oxidized film which has an opening portion corresponding to a p-type separation layer forming region is formed on the front surface of the CZ-FZ silicon semiconductor substrate, similarly to the related art. Then, a boron (B) ion implantation region is formed in a portion of the surface layer of the CZ-FZ silicon semiconductor substrate which is exposed through the opening portion of the thermally-oxidized film for the p-type separation layer. The thermally-oxidized film which is provided in a portion of the front surface of the CZ-FZ silicon semiconductor substrate surrounded by the p-type separation layer is used as a dopant mask (ion implantation mask) for ion implantation. An ion implantation dose may be, for example, about $1 \times 10^{15}$ cm$^{-2}$. Then, the thermally-oxidized film which is used as the dopant mask for boron is removed and the thermally-oxidized films, which are the characteristics of the invention, are formed with a thickness of, for example, about 1.5 µm on two main surfaces of the CZ-FZ silicon semiconductor substrate again. The thermally-oxidized films may be formed by the well-known method according to the related art. Then, thermal diffusion is performed at a high temperature for a long time in order to form the p-type separation layer.

In the process of implanting silicon atoms into the surface layers of two main surfaces of the CZ-FZ silicon semiconductor substrate, which is the second method according to the embodiment of the invention, first, similarly to the first method, the thermally-oxidized film for the p-type separation layer is formed as a dopant mask on the front surface of the CZ-FZ silicon semiconductor substrate. Then, similarly to the first method, a boron ion implantation region is formed in a portion of the surface layer of the CZ-FZ silicon semiconductor substrate, which is exposed through an opening portion of the thermally-oxidized film for the p-type separation layer, by ion implantation. An ion implantation dose is the same as that in the first method. The thermally-oxidized film serving as a dopant mask is removed and silicon (Si) ions are implanted into the entire two main surfaces of the CZ-FZ silicon semiconductor substrate at an acceleration energy of 50 keV and with a dose of $1 \times 10^{15}$ (cm$^{-2}$). Then, similarly to the first method, a thermal diffusion process is performed at a high temperature for a long time in order to form the p-type separation layer.

The thermal diffusion according to the invention which is performed at a high temperature for a long time after one of the processes (the process of forming the thermally-oxidized films on two main surfaces of the substrate (first method) or the process of implanting silicon ions into two main surfaces of the substrate (second method)) is performed under thermal diffusion conditions of, for example, a temperature of 1300° C. and 100 hours in a mixed gas atmosphere which includes inert gas, such as nitrogen ($N_2$) gas, argon (Ar), helium (He), neon (Ne), krypton (Kr), xenon (Xe), or radon (Rn), as main component gas and oxygen gas to form the p-type diffusion layer at a depth of about 120 µm (when the reverse breakdown voltage is 600 V). When nitrogen gas is used as the inert gas, it is preferable that the mixed gas atmosphere having the nitrogen gas as a main component be a mixed gas atmosphere of 30% of oxygen ($O_2$) and 70% of nitrogen ($N_2$). For example, furnace entrance and exit start temperatures may be 700° C. and the rate of temperature increase or decrease from the start temperature to 1300° C. may be 1° C./minute.

Next, the process of performing thermal diffusion at a temperature of 1300° C. for 100 hours in the mixed gas atmosphere having nitrogen gas as a main component will be described. A comparative example in which a nitrogen precipitate defect occurs in the CZ-FZ silicon semiconductor substrate and an example according to the invention in which the occurrence of the nitrogen precipitate defect is suppressed will be described while being compared with each other. In the example according to the invention, the process (the first method or the second method) for providing a supply source for an interstitial Si atom with a large diffusion coefficient on the surface or the surface layer of the silicon semiconductor substrate is performed immediately before the thermal diffusion of the separation layer requiring a high temperature and a long processing time according to the semiconductor device producing method of the invention. In contrast, in the comparative example, the process according to the invention is not performed (neither the first method nor the second method is performed). FIG. 5 schematically illustrates the state of the example after the thermal diffusion is performed at a high temperature for a long time in order to form the separation layer.

Figure 5A:
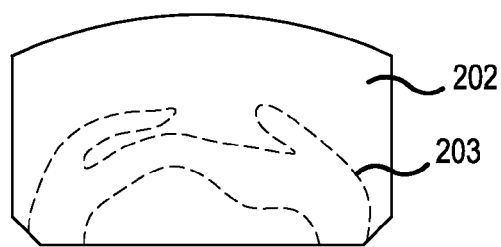
FIGS. 5A to 5C are plan views schematically illustrating the result of X-ray topography, which is represented by a dashed line, in a comparative example after thermal diffusion is performed at a temperature of 1300° C. for 100 hours in a mixed gas atmosphere including nitrogen gas as a main component.
Figure 5B:
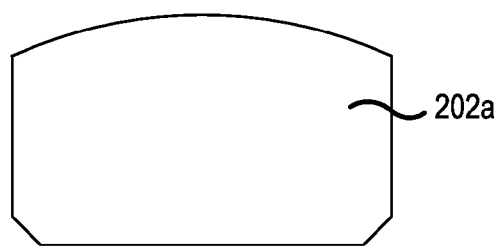
Figure 5C:
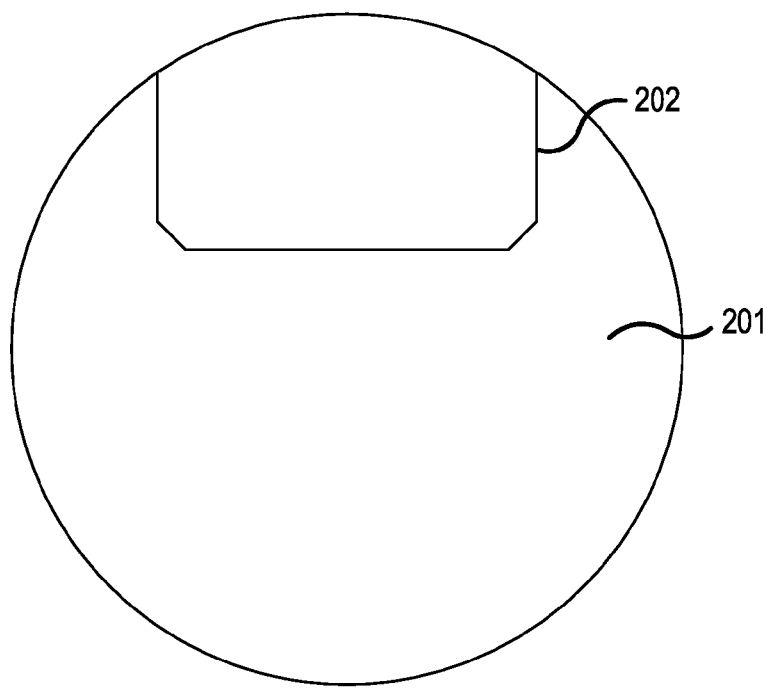
Figure 6A:
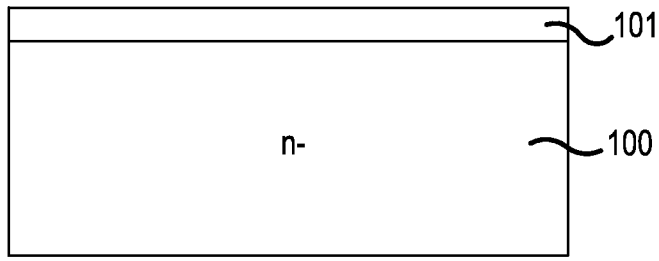
FIGS. 6A to 6D are cross-sectional views illustrating the state of a separation layer which is being formed by coating diffusion according to the related art.
Figure 6B:
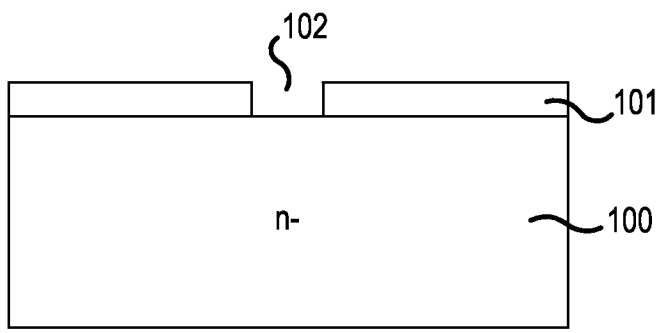
Figure 6C:
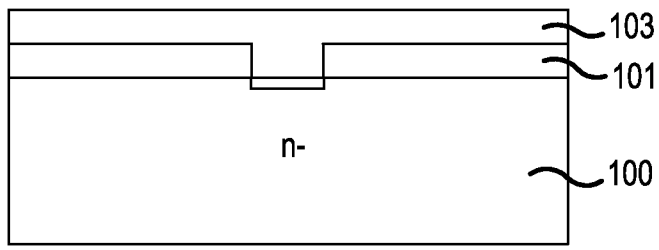
Figure 6D:
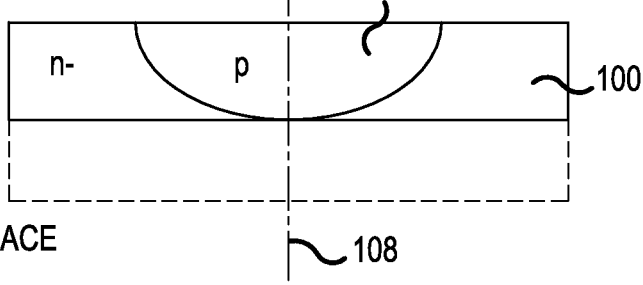
Figure 7A:
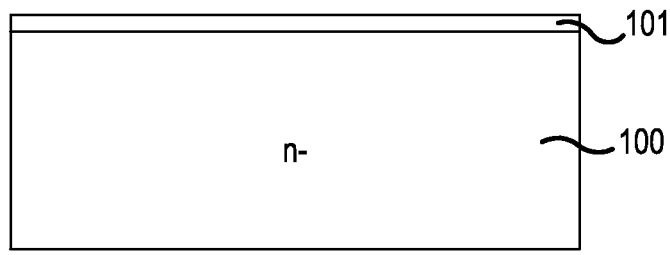
FIGS. 7A to 7D are cross-sectional views illustrating the state of a separation layer which is being formed by ion implantation according to the related art.
Figure 7B:
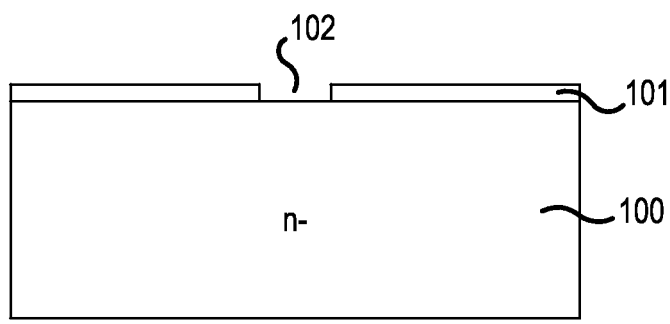
Figure 7C:
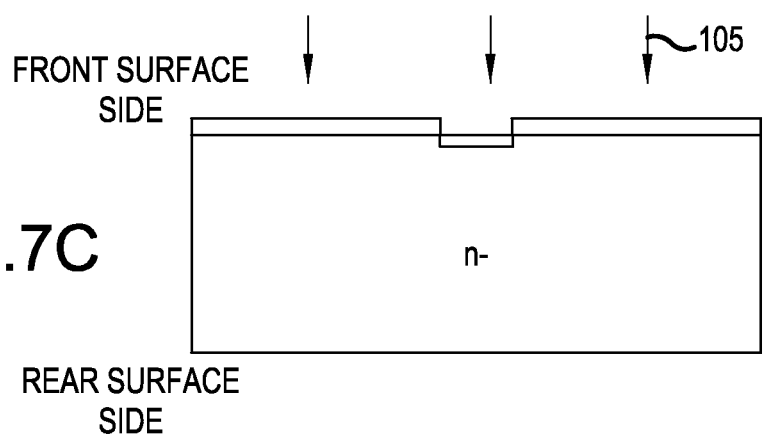
Figure 7D:
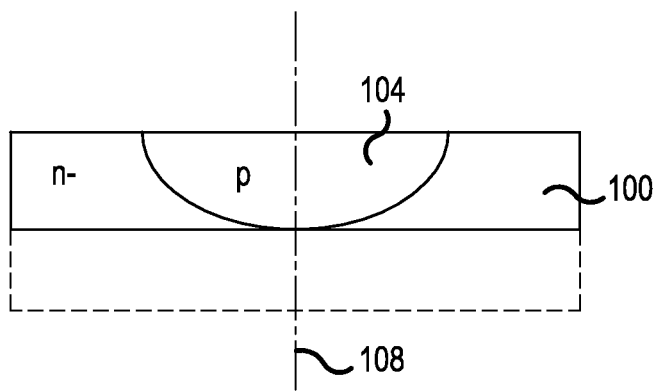

FIG. 5 is a plan view schematically illustrating the result of X-ray topography, which is represented by a dashed line, in the comparative example after thermal diffusion is performed at a temperature of 1300° C. for 100 hours in the mixed gas atmosphere having nitrogen gas as a main component. FIG. 5C illustrates the observation position of the X-ray topography in a CZ-FZ silicon semiconductor substrate 201. FIG. 5A is a plan view illustrating the comparative example in which the observation result of X-ray topography obtained by scanning a measurement region 202, which is represented by a solid line in the CZ-FZ silicon semiconductor substrate 201 illustrated in FIG. 5C, with X-rays is represented by a dashed line and is shown as a region 203. The observation result of X-ray topography indicates the region 203 in which a nitrogen precipitate defect occurs. In other words, in the comparative example, FIG. 5A illustrates that, when a thermal diffusion process is performed for the CZ-FZ silicon semiconductor substrate 201 at a temperature of 1300° C. for 100 hours in the mixed gas atmosphere which includes nitrogen gas as a main component and oxygen gas, a crystal defect occurs in the region 203 represented by a dashed line in the measurement region 202 due to a precipitate. The inventors found that the nitrogen precipitate was a nitride which mainly had a α-Si$_3$N$_4$ crystal structure, from the analysis result obtained from separate EDX element analysis (energy dispersive X-ray spectroscopy) and an electron beam diffraction image.

It was found that, when the separation layer was formed in the mixed gas atmosphere which included nitrogen gas as a main component and oxygen gas by the producing method according to the related art, using the CZ-FZ silicon semiconductor substrate, and a reverse blocking IGBT was produced as in the above-mentioned comparative example, the nitride which mainly had the α-Si$_3$N$_4$ crystal structure was precipitated on the CZ-FZ silicon semiconductor substrate, resulting in a reverse breakdown voltage failure and a forward breakdown voltage failure.

FIG. 5B is a plan view illustrating the observation result of X-ray topography for a measurement region 202a of an FZ silicon semiconductor substrate that is cut from an FZ silicon crystal, which is produced from FZ polycrystalline silicon by the FZ method, after the process according to the invention is performed. As can be seen from FIG. 5B, no nitrogen precipitate defect occurs in the measurement region 202a. However, a reverse breakdown voltage failure and a forward breakdown voltage failure occur when the FZ silicon semiconductor substrate is used, but the process according to the invention is performed, particularly, the separation layer is formed in an atmosphere including nitrogen. The FZ silicon semiconductor substrate is a silicon semiconductor substrate that is cut from an FZ silicon crystal which is produced from FZ polycrystalline silicon by the FZ method. The FZ polycrystalline silicon is a polysilicon rod with a substantially cylindrical shape which is used in the FZ method.

Figure 4:
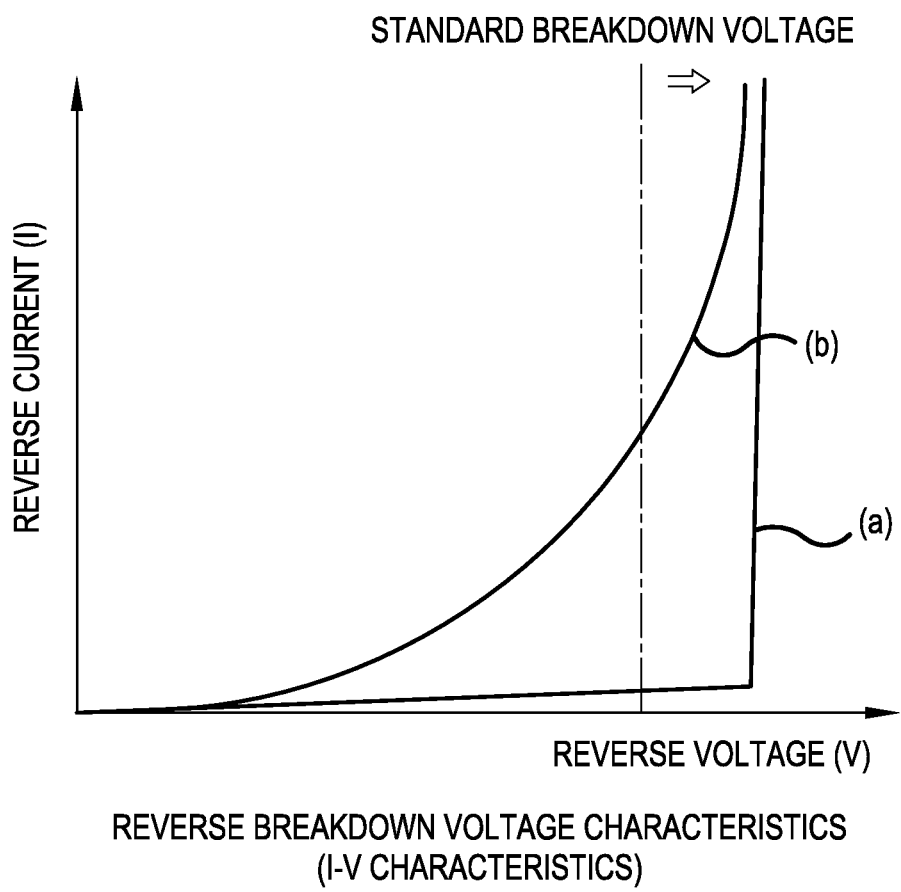
FIG. 4 is a characteristic diagram illustrating the influence of a crystal defect on the waveform of a reverse breakdown voltage in the reverse blocking IGBT.

FIG. 4 is a characteristic diagram illustrating the influence of a crystal defect on the reverse breakdown voltage waveform (current (I)-voltage (V) waveform) of the reverse blocking IGBT. When there are few crystal defects in the semiconductor substrate, a hard waveform illustrated in FIG. 4A in which the rising of a current is angulated appears. On the other hand, when the semiconductor substrate includes a region having a few crystal defects caused by, for example, the nitrogen precipitate as in the above-mentioned comparative example, a soft waveform illustrated in FIG. 4B in which the current rises gently appears. As can be seen from the comparison between the reverse currents in the I-V waveforms illustrated in FIG. 4A and FIG. 4B at a standard breakdown voltage which is represented by a one-dot chain line in FIG. 4, the reverse current, that is, a reverse leakage current in the soft waveform illustrated in FIG. 4B is more than that in the hard waveform illustrated in FIG. 4A. In the device in which the reverse leakage current is greater than a predetermined reference value, a reverse breakdown voltage failure occurs.

In the surface of one CZ-FZ silicon semiconductor substrate (wafer), a reverse blocking IGBT which is divided into a chip so as to include the region 203 in which the nitrogen precipitate defect illustrated in FIG. 5(a) occurs is defective. The yield of the reverse blocking IGBT per CZ-FZ silicon semiconductor substrate (wafer) depends on the area of the region 203 in which the nitrogen precipitate is generated and is in the range of about 40% to 50% at most.

Figure 3A:
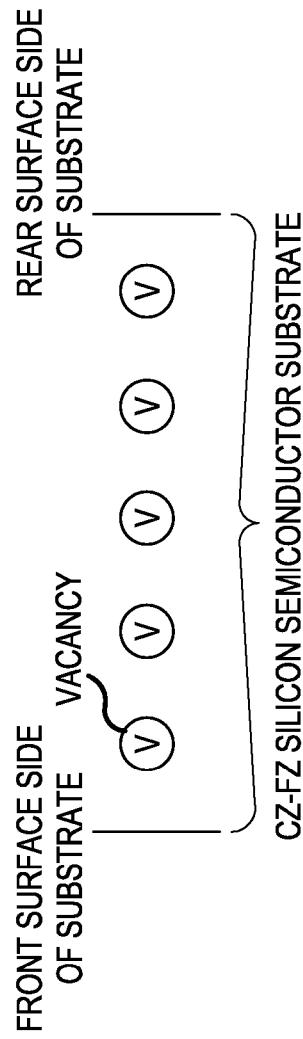
FIGS. 3A and 3B are diagrams schematically illustrating the state of a CZ-FZ silicon semiconductor substrate which is being formed when a reverse blocking IGBT according to the related art is produced.
Figure 3B:
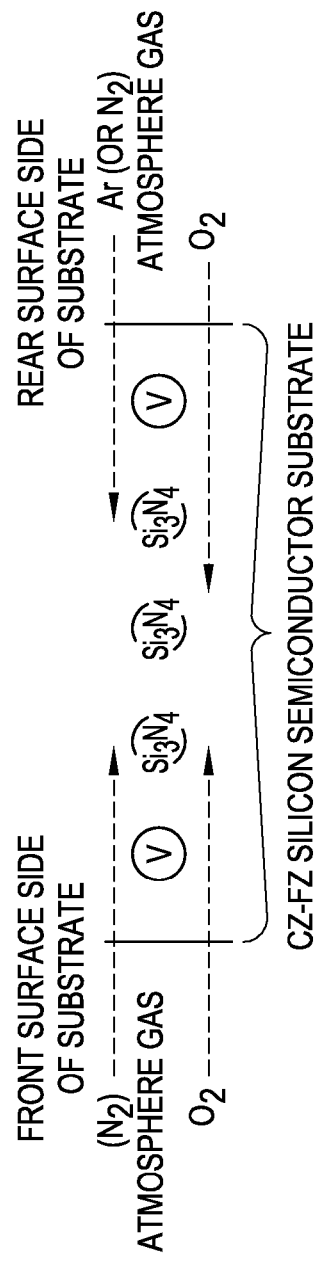

FIG. 3 is a diagram schematically illustrating the state of the CZ-FZ silicon semiconductor substrate which is being formed when the reverse blocking IGBT according to the related art is produced. FIG. 3 is a diagram illustrating the generation mechanism of a Si$_3$N$_4$ precipitate (nitrogen precipitate defect) when a thermal diffusion process is performed at a high temperature for a long time to form a deep separation layer that is required to produce a reverse blocking IGBT with the producing method according to the related art, using the CZ-FZ silicon semiconductor substrate. FIG. 3A schematically illustrates a state in which a large number of vacancies are formed in the CZ-FZ silicon semiconductor substrate (before a producing process). When thermal diffusion is performed at a high temperature for a long time in a mixed gas atmosphere which includes nitrogen as a main component and oxygen gas, a Si$_3$N$_4$ precipitate is generated on the interface between the vacancies since the solubility limit ($4 \times 10^{15}$ atoms/cm$^3$) of nitrogen is low and a crystal defect occurs due to the precipitate (FIG. 3B). It has been known that a vacancy is likely to be generated in the CZ-FZ silicon crystal when the CZ-FZ silicon crystal ingot is produced. Therefore, as described above, a large number of vacancies are formed in the CZ-FZ silicon semiconductor substrate which is cut from the CZ-FZ silicon crystal ingot. As the processing time of high-temperature thermal diffusion increases, the region 203 in which the precipitate is generated becomes wider.

Figures 1A, 1B, 1C:
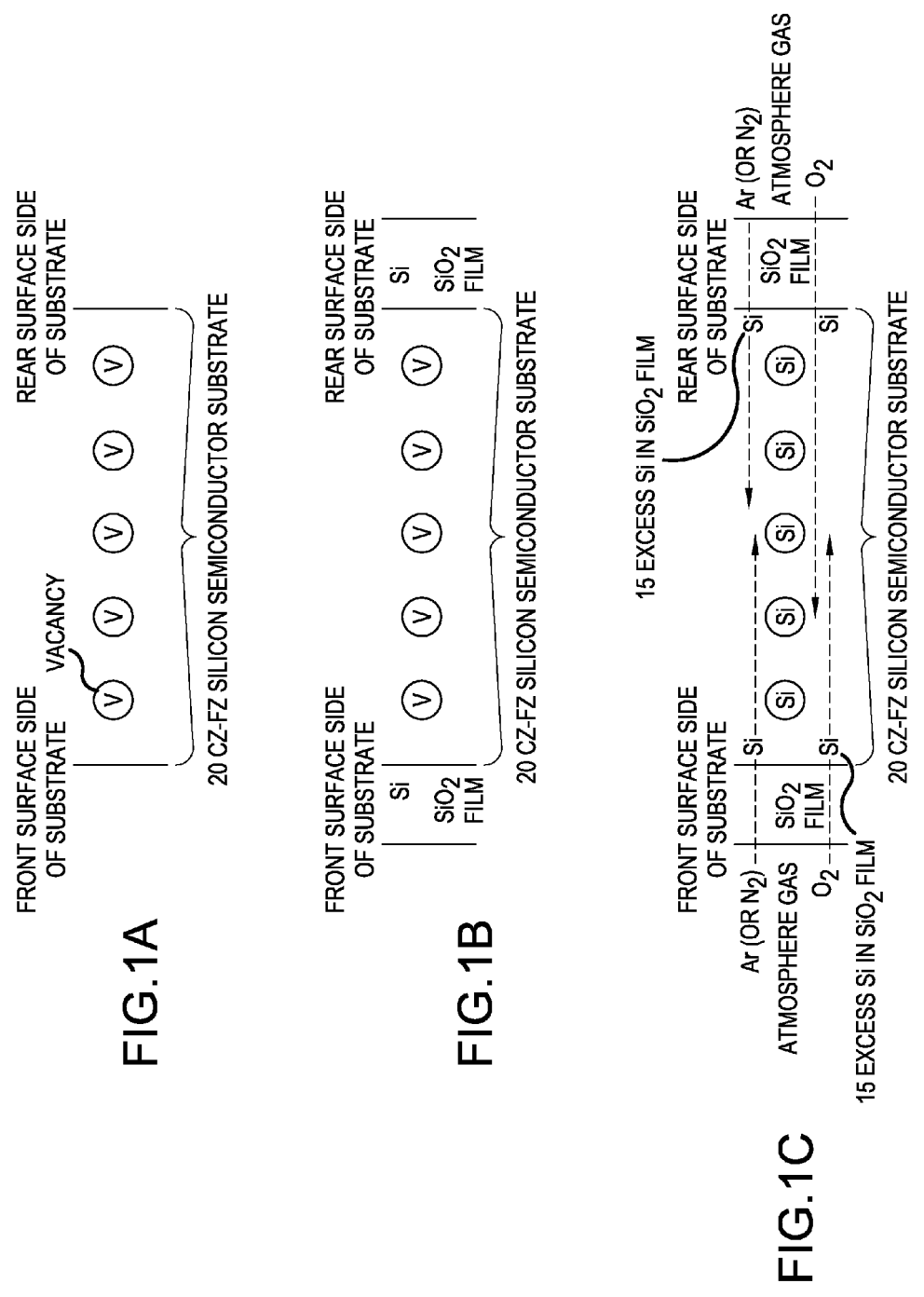

Next, the mechanism of suppressing the occurrence of a crystal defect when the process of forming the p-type separation layer, which is the characteristics of the invention, is performed in the method for producing the reverse blocking IGBT according to the invention will be described in detail. First, the thermally-oxidized films with a thickness of about 1.5 μm are formed on two main surfaces of the CZ-FZ silicon semiconductor substrate (the CZ-FZ silicon semiconductor substrate, with the thermally-oxidized film, which is a dopant mask, being removed, after boron ions are selectively implanted) immediately before thermal diffusion for forming the separation layer requiring a high-temperature and long-term process (first method). Alternatively, a process of implanting Si ions into two main surfaces of the CZ-FZ silicon semiconductor substrate with a dose of $1 \times 10^{15}$ (cm$^{-2}$) at an acceleration energy of 50 keV (second method) is performed. Then, thermal diffusion is performed at a temperature of 1300° C. for 100 hours in the mixed gas atmosphere which includes nitrogen gas (or Ar gas) as a main component and oxygen gas. The furnace entrance temperature and the furnace exit temperature were 700° C. and the rate of temperature increase and decrease was 1° C./minute. In this case, even though the CZ-FZ silicon semiconductor substrate was used, the observation result proved that a crystal defect due to a precipitate did not occur, which was the same as the observation result of X-ray topography when the FZ silicon semiconductor substrate illustrated in FIG. 5B was used, unlike the comparative example illustrated in FIG. 5A. The result will be described with reference to FIGS. 1 and 2.

FIG. 1 is a diagram schematically illustrating the mechanism in which no nitrogen precipitate defect occurs in the first method of the method for producing the semiconductor device according to the invention. FIG. 1 illustrates the mechanism in which no precipitate is generated when thermal diffusion is performed at a temperature of 1300° C. for 100 hours in a mixed gas atmosphere which includes Ar gas or nitrogen gas as a main component and oxygen gas after the thermally-oxidized films, which are the characteristics of the invention, are formed on two main surfaces of the CZ-FZ silicon semiconductor substrate. FIG. 1A illustrates the CZ-FZ silicon semiconductor substrate including vacancies. FIG. 1B illustrates a state in which the thermally-oxidized films are formed on two main surfaces of the CZ-FZ silicon semiconductor substrate. FIG. 1C illustrates the mechanism in which, when thermal diffusion for forming a separation layer is performed for the CZ-FZ silicon semiconductor substrate illustrated in FIG. 1B in an atmosphere including inert gas, the vacancies of the CZ-FZ silicon semiconductor substrate are filled with silicon atoms and a nitrogen precipitate is not generated in the vacancy.

Figure 2B:
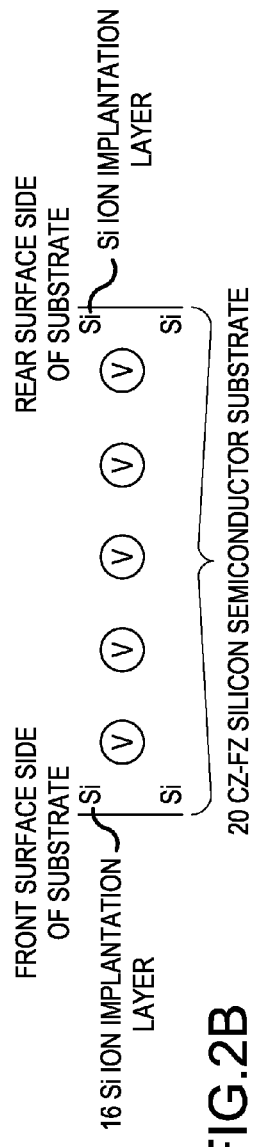
Figure 2C:
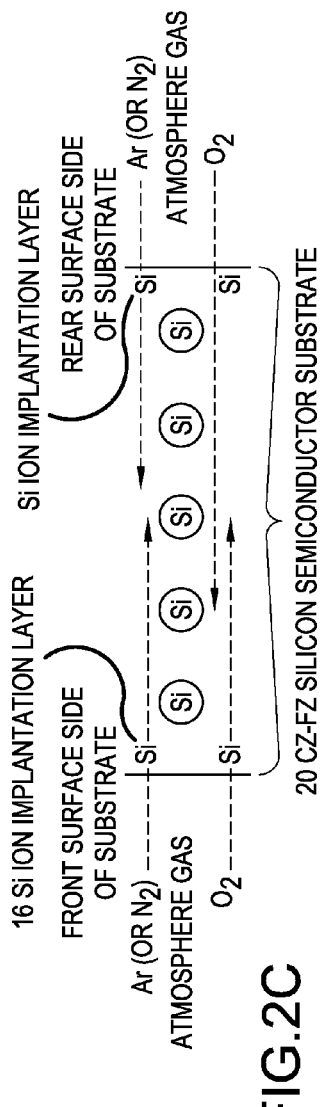

FIG. 2 is a diagram schematically illustrating the mechanism in which a nitrogen precipitate defect does not occur in the second method of the method for producing the semiconductor device according to the invention. FIG. 2 illustrates the mechanism in which a precipitate is not generated when Si ions are implanted into two main surfaces of the CZ-FZ silicon semiconductor substrate with a dose of $1 \times 10^{15}$ (cm$^{-2}$) at an acceleration energy of 50 keV and then thermal diffusion is performed at a temperature of 1300° C. for 100 hours in a mixed gas atmosphere which includes Ar gas or nitrogen gas as a main component and oxygen gas. FIG. 2A illustrates the CZ-FZ silicon semiconductor substrate including vacancies. FIG. 2B illustrates a state in which the silicon ion implantation layers are formed in the surface layers of two main surfaces of the CZ-FZ silicon semiconductor substrate. FIG. 2D illustrates the mechanism in which, when thermal diffusion for forming a separation layer is performed for the CZ-FZ silicon semiconductor substrate illustrated in FIG. 2B in an atmosphere including inert gas, the vacancies of the CZ-FZ silicon semiconductor substrate are filled with silicon atoms and a nitrogen precipitate is not generated in the vacancy.

In the first method, when the thickness of the thermally-oxidized film is equal to or greater than 1.0 μm, the effect of the invention is obtained. In particular, it is preferable that the thickness of the thermally-oxidized film be about 1.5 μm. The reason why the thickness of the thermally-oxidized film is preferably about 1.5 μm is that, when the thickness of the oxide film is too small, the oxide film disappears during thermal diffusion and Si is introduced into the substrate in a different way. In addition, it is preferable that the thickness of the thermally-oxidized film be equal to or less than about 2.5 μm. The reason is that, when the oxide film is too thick, the substrate is broken by thermal stress during diffusion. In addition, in the implantation of silicon ions in the second method, a dose is preferably in the range of $1 \times 10^{15}$ (cm$^{-2}$) to $1 \times 10^{16}$ (cm$^{-2}$). In particular, the dose is preferably about $1 \times 10^{15}$ (cm$^{-2}$). The reason why the dose is preferably about $1 \times 10^{15}$ (cm$^{-2}$) is that, when the dose is too small, Si ions are not uniformly introduced into the substrate and the vacancies are not likely to be filled with the Si ions. The CZ-FZ silicon semiconductor substrate includes impurities which are included in a CZ silicon single crystal or an initial defect (vacancy) which occurs due to the producing conditions of an FZ silicon single crystal ingot at the beginning. In the invention, when the thermally-oxidized films are formed on two main surfaces of the CZ-FZ silicon semiconductor substrate by the first method or when Si ions are implanted by the second method, Si atoms which have not been bonded to oxygen atoms when the thermally-oxidized films are formed in the first method according to the invention or Si atoms which are implanted by ion implantation in the second method become excess Si atoms and are present as a Si diffusion source in the surface layer of the substrate. Therefore, the Si diffusion source is diffused as an interstitial Si atom in the substrate during a high-temperature and long-term thermal diffusion process for forming a separation layer, which is the subsequent process, and fills the vacancies. Once the vacancies are filled with the Si atoms, no crystal defect occurs, regardless of the kind of gas species included in the atmosphere, even when thermal diffusion is performed at a high temperature for a long time.

Specifically, the known diffusion coefficient D of the interstitial Si atom at a temperature of 1300° C. is $5.0 \times 10^{-8}$ cm$^2$/sec. The diffusion distance ($=2(Dt)^{1/2}$) of the interstitial Si atom by thermal diffusion which is performed at a temperature of 1300° C. for a heat treatment time t of 1 hour is about $268 \times 10^{-4}$ cm, that is, 268 μm. That is, the interstitial Si atom reaches to the center (depth: 250 μm) of the CZ-FZ silicon semiconductor substrate within 1 hour in the thermal diffusion process which is performed at a temperature of 1300° C. As a result, the thermally-oxidized film forming process or the Si ion implantation process according to the invention is performed on two main surfaces of the CZ-FZ silicon semiconductor substrate to give (form) diffusion sources for interstitial Si atoms to the surface layers of the two main surfaces of the CZ-FZ silicon semiconductor substrate. Then, the p-type separation layer is formed by the thermal diffusion of boron in an atmosphere including nitrogen gas and a reverse blocking IGBT is produced. Then, the excess Si atoms in the surface layers of the CZ-FZ silicon semiconductor substrate are diffused to the center of the CZ-FZ silicon semiconductor substrate and fill the vacancies. Therefore, it is presumed that few nitrogen precipitate defects occur and a reverse breakdown voltage failure and a forward breakdown voltage failure do not occur. The waveform of the reverse breakdown voltage of the reverse blocking IGBT is a hard waveform in which few crystal defects occur, as illustrated in FIG. 4A. Since the region illustrated in FIG. 5A in which a precipitate is generated is not present in the surface of the CZ-FZ silicon semiconductor substrate (wafer), which is only an illustrative example, a breakdown voltage failure does not occur and it is possible to obtain high yield.

In this embodiment, thermal diffusion is performed in the atmosphere including nitrogen gas (specifically, the mixed gas atmosphere including nitrogen gas as a main component and oxygen gas). However, thermal diffusion may be performed in an atmosphere including Ar gas. In this case, the same effect as described above is obtained. The silicon semiconductor substrate is not limited to the CZ-FZ silicon semiconductor substrate, but may be an FZ silicon semiconductor substrate. In this case, the same effect as that when the CZ-FZ silicon semiconductor substrate is used is obtained. However, in the mixed gas atmosphere including Ar gas as a main component and oxygen gas, when the above-mentioned semiconductor substrate producing method (the first method of providing the thermally-oxidized films on two main surfaces of the silicon semiconductor substrate or the second method of implanting Si ions into the two main surfaces, immediately before the high-temperature and long-term thermal diffusion process for forming the separation layer) is not used, a nitrogen precipitate (crystal defect) is less likely to be generated. However, when the first method of providing the thermally-oxidized film on two main surfaces of the substrate or the second method of implanting Si ions into the two main surfaces of the substrate according to the invention is performed at the same time as thermal diffusion is performed in the mixed gas atmosphere including Ar gas as a main component and oxygen gas, the operation of the interstitial Si atoms filling the vacancies is activated by the diffusion of the interstitial Si atoms and the effect is remarkable.

In the above description, the thermal diffusion temperature of the heat treatment for forming the separation layer is 1300° C. However, the thermal diffusion temperature may be, for example, 1290° C. When the thermal diffusion temperature is reduced to a temperature lower than 1290° C., no problem occurs in the breakdown voltage characteristics, but the practical problems that the thermal diffusion time increases and operation efficiency is reduced occur, which is not preferable. Specifically, when a deep separation layer required for a reverse blocking IGBT with a reverse breakdown voltage of 600 V is formed by thermal diffusion, for example, thermal diffusion at a temperature of 1300° C. requires a heat treatment time of 100 hours and thermal diffusion at a temperature of 1280° C. requires a heat treatment time of 150 hours. As a result, efficiency is reduced. Therefore, it is preferable that the temperature of a heat treatment for forming the separation layer be equal to or higher than 1290° C. In addition, the upper limit of the temperature of the heat treatment for forming the separation layer can increase to a value at which the deformation of the silicon semiconductor substrate which affects a wafer process does not occur. When the silicon semiconductor substrate is not deformed, the thermal diffusion time can be reduced as the thermal diffusion temperature increases, which is preferable. That is, it is preferable that the temperature of the heat treatment for forming the separation layer be equal to or lower than the melting point of Si. The reason is that, at the temperature (about 1350° C.), the silicon semiconductor substrate is not melted and the semiconductor substrate is not deformed.

As described above, according to the embodiment of the invention, immediately before the high-temperature and long-term thermal diffusion process for forming the separation layer is performed, the first method of providing the thermally-oxidized films on two main surfaces of the silicon semiconductor substrate or the second method of implanting Si ions into the two main surfaces is performed to give a Si diffusion source to the surface layers of the two main surfaces of the silicon semiconductor substrate. When the high-temperature and long-term thermal diffusion process for forming the separation layer is performed, the vacancies of the silicon semiconductor substrate are filled with the Si diffusion sources. Therefore, it is possible to suppress the occurrence of a crystal defect even in a semiconductor device producing method including a process of forming a deep diffusion layer involving thermal diffusion which is performed at a high temperature of 1290° C. or more for a long time of 100 hours or more, using the CZ-FZ silicon semiconductor substrate in which the crystal defect is likely to occur, in order to increase a diameter and to reduce costs.

In the above-described embodiment of the invention, the high-temperature and long-term thermal diffusion process for forming the p-type separation layer of the reverse blocking IGBT has been mainly described. However, the invention can also be applied to a semiconductor device producing method including a process of forming a deep diffusion layer involving thermal diffusion which is performed at a high temperature of 1290° C. or more for a long time more than 100 hours. In addition, in the invention, the conductivity types may be reversed. In this case, the same effect as described above is obtained.

INDUSTRIAL APPLICABILITY

As described above, the semiconductor device producing method according to the invention is useful for a semiconductor device that includes a deep impurity diffusion layer involving a high-temperature and long-term thermal diffusion process.

Thus, a method for producing a semiconductor device has been described according to the present invention. The method include: a diffusion step of forming, on a CZ-FZ silicon semiconductor substrate, a deep diffusion layer involving a high-temperature and long-term thermal diffusion process which is performed at a thermal diffusion temperature of 1290° C. to a melting temperature of a silicon crystal for 100 hours or more; and a giving step of giving a diffusion source for an interstitial silicon atom to surface layers of two main surfaces of the silicon semiconductor substrate before the high-temperature and long-term thermal diffusion process. The step of giving the diffusion source for the interstitial silicon atom to the surface layers of the two main surfaces of the silicon semiconductor substrate is performed by forming thermally-oxidized films on the two main surfaces of the silicon semiconductor substrate or by implanting silicon ions into the surface layers of the two main surfaces of the silicon semiconductor substrate. Therefore, even when the producing method includes the step of forming the deep diffusion layer involving the high-temperature and long-term thermal diffusion process which is performed at a temperature of 1290° C. or more for 100 hours or more, it is possible to suppress the occurrence of a crystal defect. Many modifications and variations may be made to the techniques and structures described and illustrated herein without departing from the spirit and scope of the invention. Accordingly, it should be understood that the methods and devices described herein are illustrative only and are not limiting upon the scope of the invention.

EXPLANATIONS OF LETTERS OR NUMERALS

1 $n^-$ DRIFT REGION (SILICON SEMICONDUCTOR SUBSTRATE)
2 p-TYPE BASE REGION
3 $n^+$ EMITTER REGION
4 GATE INSULATING film
5 GATE ELECTRODE
6 INTERLAYER INSULATING film
9 EMITTER ELECTRODE 10 p-TYPE COLLECTOR REGION
11 COLLECTOR ELECTRODE
12 SIDE END SURFACE OF CHIP
13 SURFACE OF BREAKDOWN VOLTAGE STRUCTURE REGION
31 p-TYPE SEPARATION LAYER
110 ACTIVE REGION
120 BREAKDOWN VOLTAGE STRUCTURE REGION

What is claimed is:

1. A method for producing a semiconductor device comprising:
    a diffusion step of forming a diffusion layer with a high-temperature and long-term thermal diffusion process which is performed for 100 hours or more on a silicon semiconductor substrate produced by a floating zone method, at a thermal diffusion temperature of at least about 1290° C. to a melting temperature of a silicon crystal; and
    a giving step of giving a diffusion source for a silicon atom, which becomes an interstitial atom in the silicon semiconductor substrate in the diffusion step, to surface layers of two main surfaces of the silicon semiconductor substrate before the diffusion step
wherein the semiconductor substrate is cut from a silicon crystal, which is produced by the floating zone method using crystal silicon produced by a Czochralski method as a raw material and wherein the giving step is a step of implanting the silicon atoms into surface layers of the two main surfaces of the silicon semiconductor substrate.

2. The method for producing a semiconductor device according to claim 1, wherein a dose of the silicon atoms implanted in the giving step is equal to or greater than $1 \times 10^{14}$ (cm$^{-2}$).

3. The method for producing a semiconductor device according to claim 1, wherein the dose of the silicon atoms implanted in the giving step is in the range of $1 \times 10^{15}$ (cm$^{-2}$) to $1 \times 10^{16}$ (cm$^{-2}$).

4. The method for producing a semiconductor device according to claim 1, wherein the diffusion step forms the diffusion layer which will be a separation layer forming a reverse blocking insulated gate bipolar transistor.

5. The method for producing a semiconductor device according to claim 1, wherein thermal diffusion temperature is at least about 1300° C.

6. The method for producing a semiconductor device according to claim 1, wherein thermal diffusion temperature is less than or equal to about 1300° C.

* * * * *